(12) United States Patent　　　　(10) Patent No.:　US 12,687,778 B2
De Schepper et al.　　　　　　　　(45) Date of Patent:　　Jul. 21, 2026

(54) GAS-BASED DEVELOPMENT OF ORGANOMETALLIC RESIST IN AN OXIDIZING HALOGEN-DONATING ENVIRONMENT

(71) Applicant: Inpria Corpoartion, Corvallis, OR (US)

(72) Inventors: Peter De Schepper, Winegem (BE); Brian J. Cardineau, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 486 days.

(21) Appl. No.: 18/205,694

(22) Filed: Jun. 5, 2023

(65) Prior Publication Data

US 2023/0408916 A1　　Dec. 21, 2023

Related U.S. Application Data

(60) Provisional application No. 63/349,187, filed on Jun. 6, 2022.

(51) Int. Cl.
　　*G03F 7/004*　　　(2006.01)
　　*G03F 7/36*　　　(2006.01)
　　*G03F 7/38*　　　(2006.01)

(52) U.S. Cl.
　　CPC .............. *G03F 7/0042* (2013.01); *G03F 7/36* (2013.01); *G03F 7/38* (2013.01)

(58) Field of Classification Search
　　CPC ........................................................ G03F 7/36
　　See application file for complete search history.

(56) References Cited

U.S. PATENT DOCUMENTS 9,176,377 B2　　11/2015　Stowers et al.
9,281,207 B2　　3/2016　Stowers et al.
(Continued)

FOREIGN PATENT DOCUMENTS

WO　　2019-217749 A1　　11/2019
WO　　2020-039615 A1　　2/2020
(Continued)

OTHER PUBLICATIONS

Hänssgen et al., "Synthese Der Ersten Mono-t-Butylzinn-Elementverbidungen", Journal of Organometallic Chemistry, vol. 293 No. 191, (1985).
(Continued)

*Primary Examiner* — Chanceity N Robinson
(74) *Attorney, Agent, or Firm* — Christensen, Fonder, Dardi, Busse; Diane E. Bennett; Peter S. Dardi

(57)　　　　ABSTRACT

A method provides for performing a dry development of an organotin composition patterned with radiation and having a latent image. The method comprises developing a structure with a gas comprising a halogen based developer and an oxygen source compound, wherein the structure comprises a substrate with layer of composition with a latent image with regions with at least partially condensed tin oxide-hydroxide and separate regions with an organotin composition having carbon-tin bonds, and wherein the developing results in at least partial removal of the organotin composition having carbon-tin bonds. Contact with an oxidizing environment can be performed as a separate step followed by the halogen based thermal development. Suitable apparatuses provide for the desired processing.

21 Claims, 5 Drawing Sheets

(56)            References Cited

U.S. PATENT DOCUMENTS

| | | | |
|---|---|---|---|
| 9,310,684 | B2 | 4/2016 | Meyers et al. |
| 10,228,618 | B2 | 3/2019 | Meyers et al. |
| 10,642,153 | B2 | 5/2020 | Meyers et al. |
| 11,480,874 | B2 | 10/2022 | Kocsis et al. |
| 2014/0352736 | A1 | 12/2014 | Yamamoto et al. |
| 2017/0102612 | A1 | 4/2017 | Meyers et al. |
| 2020/0326627 | A1 | 10/2020 | Jiang et al. |
| 2021/0271170 | A1 | 9/2021 | Telecky et al. |
| 2022/0020584 | A1* | 1/2022 | Volosskiy ............... G03F 7/167 |
| 2022/0035247 | A1 | 2/2022 | Tan et al. |
| 2022/0064192 | A1 | 3/2022 | Edson et al. |

FOREIGN PATENT DOCUMENTS

| | | | |
|---|---|---|---|
| WO | 2020-132281 | A1 | 6/2020 |
| WO | 2020-264158 | A1 | 12/2020 |
| WO | 2022-016124 | A1 | 1/2022 |
| WO | 2022-125388 | A1 | 6/2022 |
| WO | 2023-245047 | A1 | 12/2023 |

OTHER PUBLICATIONS

International Search Report from corresponding Patent Application No. PCT/US2023/024395 dated Sep. 20, 2023.

* cited by examiner

GAS-BASED DEVELOPMENT OF ORGANOMETALLIC RESIST IN AN OXIDIZING HALOGEN-DONATING ENVIRONMENT

CROSS REFERENCE TO RELATED APPLICATIONS

This application claims priority to provisional patent application 63/349,187 filed on Jun. 6, 2022 to de Schepper et al., entitled "Oxidizing Process and Development of Organometallic Resist," incorporated herein by reference.

FIELD OF THE INVENTION

The invention relates to dry development of a radiation patterned organometallic patterning composition using a halide gas developer and an oxygen containing compound to provide an oxidizing environment during the development. The invention further relates to apparatuses to perform the dry development. Further aspects of the invention relate to post irradiation process flow involving a post-exposure bake with an oxygen rich atmosphere that proceeds then to the dry development in the oxidizing atmosphere of the patterned substrate.

BACKGROUND OF THE INVENTION

Semiconductor patterning requires high-performance and high-resolution photoresists to enable smaller and smaller features. Fabrication of semiconductor devices generally involves many iterative processing steps of deposition, patterning, and etching to realize the desired devices. Patterning is generally achieved through the use of lithographic processes. In lithography, aerial patterns of radiation are translated into physical patterns by using a photoresist and a development process. The development process generally involves removal of irradiated or non-irradiated portions of the irradiated photoresist.

SUMMARY OF THE INVENTION

One aspect of the invention pertains to a method for developing a metal oxide photoresist pattern with a thermal vapor process comprising a halide and an oxidizing agent.

Another aspect of the invention pertains to a multi-step method for developing a metal oxide photoresist pattern wherein the method comprises exposing a metal oxide photoresist with a thermal process comprising an oxidizing agent, and developing the metal oxide photoresist pattern with a halide composition.

Another aspect of the invention pertains to a multi-step method for developing a metal oxide photoresist pattern comprising exposing the metal oxide photoresist to a halide composition in a thermal process, followed by exposure of the metal oxide photoresist to an oxidizing agent in a thermal process, and then exposing the metal oxide photoresist to a halide composition in a thermal process. A plasma descumming process can be performed following the thermal treatments.

Another aspect of the invention pertains to a multi-step method for developing a metal oxide photoresist pattern wherein the method comprises developing a metal oxide photoresist with a thermal vapor process comprising a halide, and exposing the metal oxide photoresist pattern to a liquid rinse/descum composition that comprises an alcohol, an ether, an ester, a carboxylic acid, or a ketone, or a mixture thereof.

Another aspect of the invention pertains to a multi-step method for developing a metal oxide photoresist pattern wherein the method comprises developing a metal oxide photoresist with a thermal vapor process comprising a halide, and exposing the metal oxide photoresist pattern to a gaseous rinse/descum composition that comprises an alcohol, an ether, an ester, a carboxylic acid, or a ketone, or a mixture thereof.

In a further aspect, the invention pertains to a method for performing a dry development of an organotin composition patterned with radiation with a latent image. The irradiation may be effective to cleave a carbon-tin bond. The method can comprise developing a structure with a gas comprising a halogen based developer and an oxygen source compound. The structure can comprise a substrate with layer of composition with a pattern with regions with at least partially condensed tin oxide-hydroxide and separate regions with an organotin composition having carbon-tin bonds, and the contacting can result in at least partial removal of the organo-tin composition having carbon-tin bonds.

In an additional aspect, the invention pertains to a development chamber comprising:

- an enclosure configured for achieving a controlled pressure through operation of a pump and suitable pressure sensors;
- a substrate support within the enclosure;
- a development energy source comprising a heater, a cooler, and/or a plasma source configured to deliver energy to a substrate mounted on the substrate support;
- a halide developer source configured to deliver a gas of halide developer into the enclosure from a reservoir through a flow regulator; and
- an oxygen compound source configured to deliver a vapor of an oxygen comprising compound into the enclosure from a reservoir through a flow regulator.

In other aspects, the invention pertains to a method for transforming an irradiated substrate to form a physical pattern along the surface. The method comprises performing in an enclosure, a post-exposure bake and developing the pattern. The performing of the post-exposure bake (PEB) involves a substrate having a surface with a pattern generated by irradiated regions and non-irradiated regions of an organometallic radiation sensitive material having carbon-metal bonds. TO perform the PEB, heating is performed at a pressure of at least about 200 Torr at a temperature from 60° C. to about 250° C. for from about 0.1 minutes to about 30 minutes under an atmosphere comprising oxygen source molecules. The development comprises introducing a halogen based development gas into the enclosure to substantially remove the non-irradiated organometallic radiation sensitive material and forming a physical pattern In some aspects, the invention pertains to a method for transforming an irradiated substrate to form a physical pattern along the surface, the method comprising the steps of developing a physical pattern, subjecting the substrate with the physical pattern on a substrate to oxidation, and contacting the oxidized patterned substrate with a halogen development gas to improve pattern development. The developing of the physical pattern can be performed by introducing a halogen development gas into an enclosure to substantially remove non-irradiated organometallic radiation sensitive material and forming a physical pattern. The subjecting of the substrate with the physical pattern on a substrate to oxidation can be performed for from about 0.1 minutes to about 30 minutes under an atmosphere comprising oxygen source molecules to form an oxidized patterned substrate.

DETAILED DESCRIPTION

Figure 1:
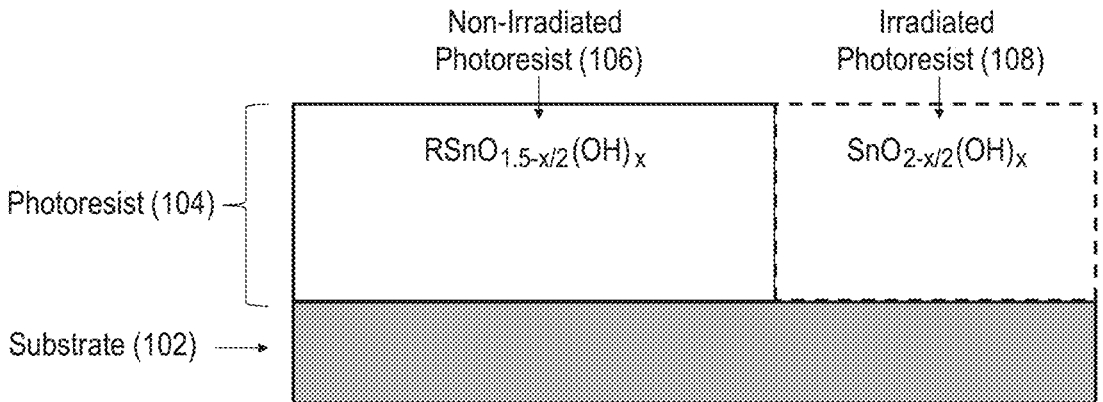
FIG. 1 is a diagram showing a side-on view of a patterned organotin photoresist having distinct compositions in the non-irradiated and irradiated regions.

Processes are presented for dry developing a latent image in a radiation sensitive tin-based patterning composition which is referred to as a resist that are designed to be more efficient and effective based on the maintenance of an oxidizing environment to reduce residue remaining from pattern development. The dry development is achieved using a halide donating vapor along with an oxidizing vapor. This development provides for converting of irradiated resist into a product that has a sufficient vapor pressure that can be simultaneously or sequentially removed in a thermal driven process. Also, a separate oxidation step can be performed in addition or as an alternative to use of an oxidizing gas during halide based thermal development. The tin-based patterning compositions generally include at least one radiation sensitive carbon-tin bond in the unirradiated composition within an oxo-hydroxo network. Absorption of radiation can cleave the carbon-tin bonds. Pattern quality can be further improved through post-irradiation pre-development process and/or post development rinsing. In particular, a post-exposure bake step can introduce an oxidizing atmosphere that may be carried over into the dry development, which can be particularly convenient with a thermal driven dry development. These improvements in pattern formation can be particularly effective for exploiting the potential of extreme ultraviolet (EUV) photolithography.

The overall objective for patterning is to take a structure with a radiation sensitive coating having a latent image formed by patterned irradiation and to selectively remove material based on the pattern to form a physically patterned structure. The ability to perform the selective removal of material relies on contrast in the material conforming to the latent image of the radiation, and the development process exploits this contrast in material to perform the selective removal. The quality of the development process can depend on the contrast, the development process and sharpness of the image. Generally, there is one primary development step during which most if not all of the material is removed to form the physical pattern. Additional steps can be added to the development process, before and/or after the primary development step. For example, a preliminary step or steps may influence the coating material with the latent image to increase the contrast. A subsequent step or steps, for example, can remove scum and/or otherwise improve the pattern quality. The primary objective herein is to improve a halide based dry development process. The improvement involving the use of an oxidizing vapor can be incorporated in the primary development step and/or a preliminary step(s) and/or a subsequent step(s). In particular, a post-exposure (pre-development) bake step can incorporate an oxidizing atmosphere that can prepare the patterning material for the development step with a halide composition. Tin+4 halides are generally more volatile than tin+2 halides, so it desirable to avoid reducing tin+4 to tin+2 and correspondingly avoid the possibility of forming less-volatile species, such as $SnCl_2$. Furthermore, oxidation of Sn+2 compounds to form Sn+4 species, can mitigate the disproportionation of tin+2 species during processing that can result in formation of tin metal. Rinse steps can be performed after development to remove any residue formed in the oxidizing environment. Additional or alternative preliminary step(s) and/or subsequent step(s) can be also used to achieve desired pattern quality. For example, performing a bake step within an oxidizing environment after a first development with a halide composition can be desirable to convert non-volatilized Sn+2 species to Sn+4 species that can be better removed during a subsequent development with a halide composition. After a halide based development step, a step can be performed with an oxidizing atmosphere to oxidize any tin+2 that was formed back to tin+4. Heat may or may not be applied during the oxidation step. After the oxidation step, another halide based vapor development step can be performed to volatilize the tin+4 materials, such as through formation of $SnX_4$, where X is a halide atom. The cycle can be repeated, if desired, with another oxidation step and another halide based vapor development step. If separate oxidation steps are performed, an oxidizing gas may or may not be used during the halide based development step, but it is generally desirable to still use an oxidizing gas during the halide based development step.

Recently, metal oxide hydroxide materials have been shown to be effective photoresist compositions capable of achieving very high resolutions. To enable high resolution patterning, these metal oxide hydroxide materials are deposited as thin coatings and possess a high etch contrast in relation to conventional polymer photoresist materials, thus enabling more efficient pattern transfer into the underlying substrate. Example metal oxide hydroxide photoresists include hafnium and zirconium oxide hydroxides that have been described in U.S. Pat. No. 9,176,377B2, entitled "Patterned Inorganic Layers, Radiation Based Patterning Compositions And Corresponding Methods" by Stowers et al. and in U.S. Pat. No. 9,281,207B2, entitled "Solution Processible Hardmasks for High Resolution Lithography" by Stowers et al, both of which are incorporated herein by reference. Organotin oxide hydroxide photoresists, in particular, have been shown to achieve high resolution and high sensitivity. Organotin oxide hydroxide photoresists include organotin materials as described in U.S. Pat. No. 9,310,684B2 to Meyers et al. (the '684 patent), entitled "Organometallic Solution Based High Resolution Patterning Compositions," U.S. Pat. No. 10,642,153 to Meyers et al., entitled "Organometallic Solution Based High Resolution Patterning Compositions and Corresponding Methods," and U.S. Pat. No. 10,228,618B2 (the '618 patent), entitled "Organotin Oxide Hydroxide Patterning Compositions, Precursors, and Patterning", all of which are incorporated herein by reference. In particular, organometallic radiation sensitive resists have been developed based on organo tin compositions, such as alkyltin oxide hydroxide, approximately represented by the formula $R_zSnO_{(2-z/2-x/2)}(OH)_x$, where $0<x<3$, $0<z\leq2$, $x+z\leq4$, and R is a hydrocarbyl or organo group forming a carbon bond with the tin atom. Particularly effective forms of these compositions are monoalkytin oxide hydroxide, in which $z=1$ in the above formula. In particular, R can be a moiety with 1-31 carbon atoms with one or more carbon atoms optionally substituted with one of more heteroatom functional groups, such as groups containing 0, N, Si, Ge, Sn, Te, and/or halogen atoms, or an alkyl, or a cycloalkyl further functionalized with a phenyl, or cyano group. In some embodiments, R can comprise $\leq10$ carbon atoms and can be, for example, methyl, ethyl, propyl, isopropyl, butyl, t-butyl, isobutyl, or t-amyl. The R group can be a linear, branched, (i.e., secondary or tertiary at the metal-bonded carbon atom), or cyclic hydrocarbyl group. Each R group individually and generally has from 1 to 31 carbon atoms with 3 to 31 carbon atoms for the group with a secondary-bonded carbon atom and 4 to 31 carbon atoms for the group with a tertiary-bonded carbon atom, optionally with unsaturated or aromatic carbon bonds. In particular, branched alkyl ligands can be desirable for some patterning compositions. The formation of the oxo-hydroxo coating material can comprise deposition of a tin composition with hydrolysable bonds, such as $RSnL_3$, where L is a hydrolysable ligand, such as an alkoxide, a dialkyl amine, an acetylide or other suitable hydrolysable ligand. The hydrolysable ligands can be hydrolyzed to form the oxo-hydroxo network during deposition of the coating and/or in the coating following deposition, i.e., completing the hydrolysis after deposition. Applicant has developed methodologies to efficiently and effectively form a wide range of patterning compositions with different R groups, optionally with various hetero atoms, with C—Sn bonds, as described further in published U.S. patent application 2022/00064192 to Edson et al., entitled "Methods to Produce Organotin Compositions With Convenient Ligand Providing Reactants," incorporated herein by reference.

While not wanting to be limited by theory, it is believed that during exposure to ionizing radiation, such as EUV photons, UV photons, and ion beams, the Sn—C bonds are cleaved. This cleavage can result in volatilization of the alkyl groups, and in the creation of highly reactive Sn sites with unsatisfied coordination numbers. No direct measurements are known to elucidate the specific mechanism for bond cleavage, although mechanisms can be speculated. A cleavage mechanism may be dependent on the composition of the R-ligand. As a result of the cleavage of Sn—C bonds, densification can then occur due to crosslinking and/or condensation between Sn sites resulting from reaction with other moieties in the coating and/or by reaction with species in the processing environment, for example, water. In this way, the irradiation of the coating to a pattern of radiation creates a latent image with corresponding patterning of the density in the coating wherein the irradiated regions are generally denser than the non-irradiated regions. In a typical EUV lithography process, following exposure to EUV radiation, the coating is exposed to ambient air wherein further reaction with water, $O_2$, and/or $CO_2$ can occur within the irradiated regions of the coating to drive the formation of a condensed network, thereby creating a substantial chemical contrast between irradiated and non-irradiated regions. A post-exposure heating step can facilitate this condensation process and allow for desired degrees of condensation at lower radiation doses.

To realize the physical image of the chemical contrast, photoresists are typically developed in either a negative-tone process, wherein the non-irradiated material is selectively removed, or in a positive-tone process wherein the irradiated material is selectively removed. Organotin photoresists can operate in either tone, although optimization of processing can favor selection of particular ligands for favorable development with a particular tone. Irradiated regions of organotin oxide hydroxide coatings are generally hydrophilic and are thus soluble in aqueous acids or bases and insoluble in organic solvents; conversely, non-irradiated regions are generally hydrophobic and are thus soluble in organic solvents and insoluble in aqueous acids or bases. Some useful developer compositions for these organotin oxide photoresists have been described in published U.S. Patent Application No. 2020/0326627 to Jiang et al. (hereinafter the '627 application), entitled "Organometallic Photoresist Developer Compositions and Processing Methods", incorporated herein by reference. The dry development processing herein is specifically directed to negative-tone processing.

To perform the processing, development can be conducted using a vapor process, also known as dry development, wherein the photoresist coating is exposed to a flowing vapor or gaseous developer composition to remove unwanted material and to form a physical pattern. Some examples of dry development processes have been described in PCT Publication No. 2020/132281 A1 by Volosskiy et. al, entitled "Dry development of resists", and by Tan et. al in PCT Pat App. No: PCT/US2020/039615 (hereinafter the '615 application), entitled "Photoresist Development With Halide Chemistries", both of which are incorporated herein by reference. These dry development methods generally comprise vapor developer compositions based on the use halide chemistries. In such dry development processes, development can be achieved by exposing the irradiated substrate to a plasma or a thermal process while flowing a halide vapor comprising a small molecule containing a halide (F, Cl, Br, I), such as HBr, HCl, $BCl_3$, and the like. In some cases, dry development may offer advantages over wet development such as reduced pattern collapse and fine control over developer compositions, i.e., the vapor and/or plasma gases. The process alternatives described herein are directed to a decrease of scum formation, where scum refers to residue remaining in the portion of the latent image or adjacent edges that was intended for removal.

Improved dry development methods for organotin photoresist coatings are described herein that employ the use of an oxidizing agent to improve development of patterned organotin coatings. While not wanting to be limited by theory, halides are thought to interact with the organotin materials by binding to Sn atoms in the coating to form volatile $R_nSnX_{4-n}$ (X=halide, n=0, 1, or 2) species that are subsequently removed from the substrate, such as through evaporation. Generally, the non-irradiated regions are less dense than the irradiated regions and can therefore be removed more readily by halide developers. It has been recognized, however, that for some organotin compositions, the products that result from halogenation can be unstable and can decompose in-situ and/or prior to volatilizing and/or removal to leave unwanted non-volatile and/or non-soluble residues on the substrate, such as $SnCl_2$ or $SnBr_2$. For example, Hänssgen, D., Puff, H., and Beckerman, N. in *J. Organomet. Chem.* 1985, 293, 191, incorporated herein by reference, have described the rapid decomposition of tert-butyltin trichloride $((CH_3)_3CSnCl_3)$ into $SnCl_2$ and tert-butyl chloride above cryogenic temperatures. The decomposition reaction involves the reduction of Sn+4 to Sn+2. While Hänssgen et. al did not describe the stability of tert-butyltin tribromide or tert-butyltin triiodide, it is expected that similar decomposition reactions can occur with these tribromide and triiodide compositions as in the trichloride compositions. The tin+2 halides are not volatile under process conditions described herein. It can thus be desirable to hinder the formation of $SnX_2$, where X is a halide or other Sn+2 species, during the development process by driving oxidation and/or maintaining oxidized Sn atoms (+4 oxidation state) within the organotin coating. It can be particularly desirable to maintain tin in the +4 oxidation state for the continued exploitation of the pattern contrast. While it can be desirable to maintain tin in the +4 oxidation state during development through the use of an oxidizing gas, a separate thermal oxidation step can be used after the halide based thermal development and prior to a subsequent halide based thermal development, whether or not an oxidizing gas is included in the atmosphere during the halide based development step. The use of an oxidizing step and subsequent halide based thermal development can be repeated to have additional development cycles. An oxidizing agent can be included in a post-exposure (pre-development) bake step to have the material in an oxidized environment prior to the halide based thermal development step.

As described above, the full development process can involve multiple steps in some embodiments. The processing can involve a primary development step where most of the targeted material is removed. The primary development step in the processes of primary interest herein are a dry process in which vapor reactants and vapor by-products are involved and removed. A pre-development step or steps with reactive gases can be used to improve the development process. In particular, the adaptation of a post-exposure bake is described in the context of a pre-development step. A post development step or steps can be used to improve the developed pattern, and a post-development step may be dry or wet, i.e., solution based. A plasma etch as a post-development descumming step is described further below. The overall development process to achieve the patterned structure can be improved through the interplay between the steps as well as improvement of the primary development step.

Preparation of Coatings:

Organotin photoresist compositions can be effectively used for radiation patterning, especially EUV patterning. In general, any suitable deposition process can be used to form a radiation patternable coating on a substrate. Suitable deposition processes can include, for example, solution deposition techniques such as spin coating, spray coating, dip coating, knife edge coating, printing, such as inkjet printing and screen printing, and the like. Preparation of radiation-patternable organotin coatings is described in the '684 and '618 patents cited above.

In some embodiments, radiation-patternable organotin coatings can be formed via vapor deposition methods. Vapor deposition methods generally include chemical vapor deposition (CVD), physical vapor deposition (PVD), atomic layer deposition (ALD), and modifications thereof. In a typical vapor deposition process, the organotin composition can be reacted with small molecule gas-phase reagents such as $H_2O$, $O_2$, $H_2O_2$, $O_3$, $CH_3OH$, HCOOH, $CH_3COOH$, and the like, which serve as O and H sources for production of radiation sensitive organotin oxide and oxide hydroxide coatings. Vapor deposition of radiation patternable organotin coatings has been described in the '618 patent cited above, as well as in Wu et. al in published PCT Application WO 2019/217749 entitled "Methods for Making EUV Patternable Hard Masks", incorporated herein by reference. Production of radiation sensitive organotin coatings can generally be achieved by reacting the volatile organotin precursor $RSnL_3$ with a small gas-phase molecule. The reactions can include hydrolysis/condensation of the organotin precursor to hydrolyze the hydrolysable ligands while leaving the Sn—C bonds substantially intact.

With respect to an outline of a representative process for a radiation-based patterning generally, e.g., an extreme ultraviolet (EUV) lithographic process, photoresist material is deposited or coated as a thin film on a substrate, pre-exposure baked, exposed with a pattern of radiation to create a latent image, post-exposure baked, and then developed via a solution ("wet") process or a thermal and/or plasma process ("dry") process such as to produce a developed pattern of the resist. Fewer steps can be used if desired, and additional steps can be used to prepare a coating with a latent image for development and/or to remove residue to improve pattern fidelity. The processing of particular interest herein involves a dry development step, although in some embodiments the dry development process can be combined with an initial wet development and/or a subsequent wet rinse step.

The selected thickness of the radiation patternable coating can depend on the desired process. For use in single-patterning EUV lithography, coating thicknesses are generally chosen to yield patterns with low defectivity and reproducibility of the patterning. In some embodiments, suitable coating thickness can be between about 1 nm and about 100 nm, in further embodiments from about 1.5 nm to 50 nm, and in further embodiments from about 2 nm to 25 nm. Those of ordinary skill in the art will understand that additional ranges of coating thickness are contemplated and are within the present disclosure. Coating thickness for radiation patternable coatings prepared by vapor deposition techniques can generally be controlled through appropriate selection of reaction time or cycles of the process. Coating thicknesses for solution deposited coatings can be selected based on viscosity, solution loading and wet coating thicknesses.

The substrate generally presents a surface onto which the coating material can be deposited, and it may comprise a plurality of layers in which the surface relates to an upper most layer. The substrate is not particularly limited and can comprise any reasonable material such as silicon, silica, other inorganic materials, such as ceramics, semiconductor wafers, and polymer materials.

After deposition and formation of the radiation patternable coating, further processing can be employed prior to exposure with radiation. In some embodiments, the coating can be heated between about 30° C. and 300° C., in further embodiments between about 50° C. and 200° C., and in further embodiments between about 80° C. and 150° C. The heating can be performed, in some embodiments for about 10 seconds to about 10 minutes, in further embodiments from about 20 seconds to about 5 minutes, and in further embodiments from about 30 seconds to about 4 minutes. Additional ranges for temperatures and heating durations within the above explicit ranges are contemplated and envisioned.

Patterning and Development:

Radiation generally can be directed to the coated substrate through a mask or a radiation beam can be controllably scanned across the substrate. In general, the radiation can comprise electromagnetic radiation, an electron-beam (beta radiation), or other suitable radiation. In general, electromagnetic radiation can have a desired wavelength or range of wavelengths, such as visible radiation, ultraviolet radiation, or X-ray radiation. The resolution achievable for the radiation pattern is generally dependent on the radiation wavelength, and a higher resolution pattern generally can be achieved with shorter wavelength radiation. Thus, it can be desirable to use ultraviolet light, X-ray radiation, or an electron-beam to achieve particularly high-resolution patterns.

Following International Standard ISO 21348 (2007) incorporated herein by reference, ultraviolet light extends between wavelengths of greater than or equal to 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light at 13.5 nm has been used for lithography, and this light is generated from a Xe or Sn plasma source excited using high energy lasers or discharge pulses. Soft x-rays can be defined from greater than or equal to 0.1 nm to 5 less than 10 nm.

Based on the design of the coating material, there can be a large contrast of material properties between the irradiated regions that have condensed coating material and the unirradiated, coating material with substantially intact Sn—C bonds. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of high-resolution lines with smooth edges in the pattern following development as described in the following section.

Generally, a post-exposure heating step can be significant to further the cleavage of the R-group and thereby improving the pattern contrast. Applicant has found that a delay following irradiation (Post Exposure Delay—PED) and prior to performing a heat treatment and development can improve patterning results. The rest time of the delay can be at least about 20 minutes, in further embodiments at least about 25 minutes, and in other embodiments from about 30 minutes to about 3 days. The PED can be performed at pressures of at least about 200 Torr to pressures over an atmosphere, for example, of inert gas, oxygen, air or modified air, such as air enhanced in $CO_2$, which can be at a partial pressure of 450 ppm or greater and/or air with a water content adjusted to a target value for consistent process results. The PED can be performed at room temperature or a temperature from 40° C. to about 130° C. A person of ordinary skill in the art will recognize that additional ranges of PED parameters within the explicit ranges above are contemplated and are within the present disclosure. The use of a PED is described further in published U.S. patent application 2021/0271170A to Telecky et al. (hereinafter the '170 application), "Process Environment for Inorganic Resist Patterning," incorporated herein by reference.

A post exposure bake can be performed over different atmospheres. In the '170 application, it was found that post exposure processing was desirably done at pressures of at least 200 Torr. The atmosphere during a post-exposure bake (PEB) can be performed effectively with various atmospheres. As shown in the '170 application, a relatively modest increase in $CO_2$ concentrations can desirably increase the critical dimension from patterning, suggesting a lower dose can be used for a target resolution. The air used in the '170 application was not dried, so that it also contained water vapor. In the context of the present dry (referring to gas based and not to free of water vapor) patterning, the atmosphere used for PEB can amount to a pre-development exposure to desired vapor species, such as $O_2$, $O_3$, $H_2O$, $H_2O_2$, NO, $NO_2$ and/or $CO_2$. It is likely that some of these species remain associated with the resist material or have modified the resist material for the subsequent development step. Tin+4 ions can accept up to 6 ligands, so it is possible in the non-fully condensed material that more weakly bound neutral ligands can be present under a specific set of conditions. In particular, species creating an oxidizing environment can influence the dry development step.

A post thermal development oxidizing step can proceed similarly to the PEB step. The oxidizing step may or may not involve heating. During an oxidizing step, the atmosphere generally comprises $O_2$, $O_3$, $H_2O$, $H_2O_2$, NO, and/or $NO_2$. The atmosphere can comprise air and/or inert gases as described for the PEB, and the pressure ranges and times would apply equally here.

The development can be performed following the post exposure bake. To the extent that the atmosphere during the post exposure bake is selected to be the same or similar to the background atmosphere for the vapor phase development step, development can proceed relatively directly from the PEB, and the PEB can be considered at least a part of a preexposure of the substrate to the desired gases. In the context of a gas driven development step, background atmosphere is intended to refer to the additional gas components in the atmosphere other than the halide developing agent. If the pressure is changed, the pumping rates and/or flow rates can be adjusted accordingly. The PEB processing can be performed with an atmosphere that is selected to improve condensation of the irradiated material that is different form the desired atmosphere for the dry development, in which case the atmosphere surrounding the wafer can be appropriately exchanged, and it may be desirable to allow for the wafer to equilibrate with the altered atmosphere.

Regardless of the degree that the PEB is designed to prepare the substrate for development, the dry development process can be characterized by parameters comprising: composition of the chamber atmosphere, the chamber pressure, the flow rates, and temperature. With respect to the composition, in some embodiments, the chamber atmosphere comprises a halide developing agent, and oxidizing gas, and optional additional gases. If the halide based development is combined with a separate oxidation step, the chamber atmosphere may comprises a halide developing agent and optional additional gases, such as dihalides and inert gases, although an oxidizing gas can still be included in the development step. Suitable halide developing agents include, for example, HF, HCl, HBr, HI, $BCl_3$, or the like. Acyl halide (RCOX), such as $CH_3OCl$, and carbonyl halides $(COX_2)$, such as $COF_2$ and $COCl_2$, react with water to form corresponding hydrogen halides and would be suitable halide development agents, where X is F, Cl, Br or I, and R is an alkyl group with 1 to 5 carbon atoms. In general, mixtures of halide developer compounds can be used. The halide developer can be introduced in the chamber to establish a desired partial pressure of the gas, which can be considered independent of the total pressure and other gas constituents. The partial pressure of halide developer can be from about 50 milliTorr (mT) to about 25 Torr, in further embodiments from about 100 mT to about 15 Torr and in additional embodiments from about 100 mT to about 10 Torr. The flow rate of the halide developer can depend on the turnover rate of the chamber atmosphere and chamber size and for processing can be at least about 10 sccm (standard cubic centimeters per minute), in some embodiments from about 50 sccm to about 10,000 sccm, in further embodiments from about 100 sccm to about 2500 sccm. A person of ordinary skill in the art will recognize that addition ranges of halide developer parameters within the explicit ranges above are contemplated and are within the present disclosure. Suitable parameters for other gas components of the development process are described below.

Referring to FIG. 1, a side-on view of a patterned organotin resist 104 on a substrate 102 prior to development is shown schematically where the non-irradiated region 106 is largely an organotin oxide hydroxide composition represented by the formula $RSnO_{1.5-x/2}(OH)_x$ wherein $0<x<3$. The organotin oxide hydroxide composition generally comprises alkyl ligands having Sn—C bonds, and wherein the Sn atoms are integrated into a network of Sn—O and/or Sn—OH bonds to form an oxide hydroxide network. The irradiated region 108 is largely carbon deficient (i.e., lower concentration of Sn—C bonds) and generally denser (i.e., higher concentration of Sn—O—Sn bonds) than the non-irradiated region and is generally represented by the formula $R_zSnO_{(2-(z/2)-(x'/2))}(OH)_{x'}$, where $0<x'<4$ and z is generally significantly less than 1, i.e., the ratio of R to Sn is less than 1. It should be understood that irradiation of the organotin material leads to cleavage of the Sn—C, and the exact composition of the irradiated region can depend on the dose of the radiation delivered as well as on the subsequent processing of the film. For example, additional heating (e.g., post-exposure baking) or additional exposure to radiation (e.g., a EUV or UV flood exposure) can affect the composition of both the irradiated and non-irradiated material. In any case, the non-irradiated regions are generally less dense and more carbon-rich than the irradiated regions. One of ordinary skill in the art will realize that the formulas above for the irradiated and non-irradiated regions are generalized for pedagogical purposes and are not meant to strictly represent the full complexity of the three dimensional materials even ignoring approximations due to ubiquitous minor contaminants, which Applicant has achieved in reducing to low levels.

Figure 2:
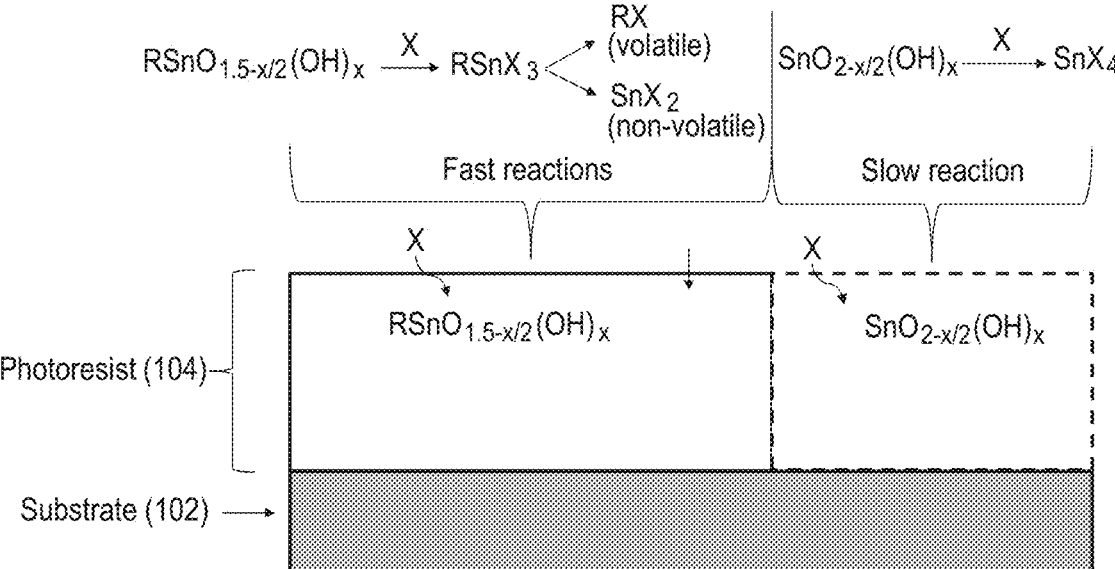
FIG. 2 is a diagram showing idealized reactions that occur between a halide (X) species and the coating compositions in the non-irradiated and irradiated regions.

Referring now to FIG. 2, the reactions with halide developer (e.g., HBr, BCl3) of each region of the photoresist are shown. For irradiated regions, which generally comprise dense Sn—O—Sn and Sn—OH networks, reaction with a halide X can occur to form volatile $SnX_4$. However, the non-irradiated region, which is generally much less dense (i.e., lower concentration of Sn—O—Sn bonds) than the irradiated region, can undergo rapid reaction with a halide to form halogenated organotin species, such as $RSnX_3$. Due to the lower density of the non-irradiated regions, the reactions in the non-irradiated regions occur significantly more rapidly, and the maintenance of the R ligand can contribute to volatility of the halogenated products. For some R groups, the instability of $RSnX_3$ can lead to rapid decomposition/ disproportionation into volatile RX and non-volatile $SnX_2$ products. It is possible that unstable halogenated organotin species other than $RSnX_3$ can be created during exposure to halide vapor, and one of ordinary skill in the art will realize that, insofar as the instability can lead to the formation of undesired by-products (e.g., $SnX_2$). The non-volatile metal species can result in scum at the end of the development process.

Figure 3:
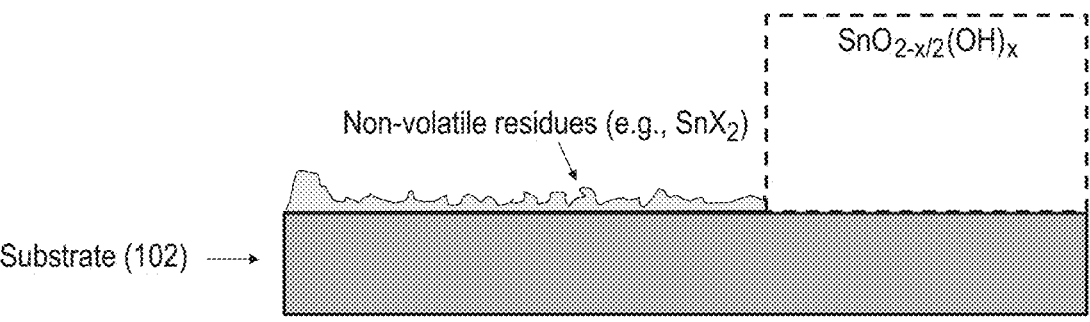
FIG. 3 is a schematic side view Shows the pattern and undesired residue resulting from dry development with a halide species.

Referring now to FIG. 3, a side-on view of the post-development pattern is shown, in which development was performed using a halide composition. The irradiated regions are essentially intact and have remained on the substrate after development, whereas the non-irradiated regions have largely been removed except for undesired residues that comprise non-volatile reaction products with halide developer compositions.

Figure 4:
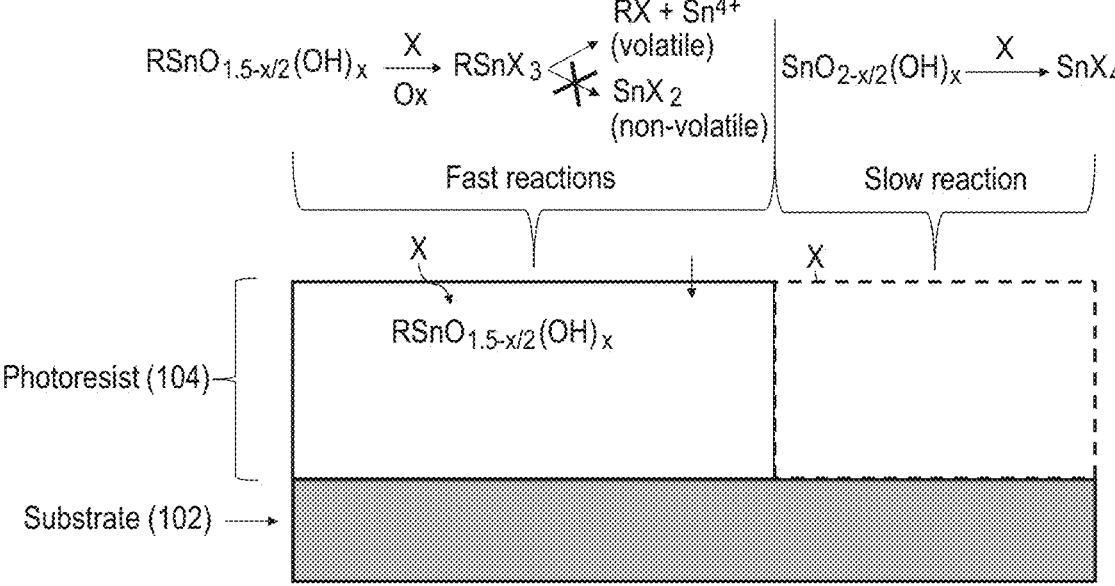
FIG. 4 is a schematic side view showing idealized reactions that occur between a halide species in the presence of an oxidizing agent and the coating composition in the non-irradiated and irradiated regions.
Figure 5:
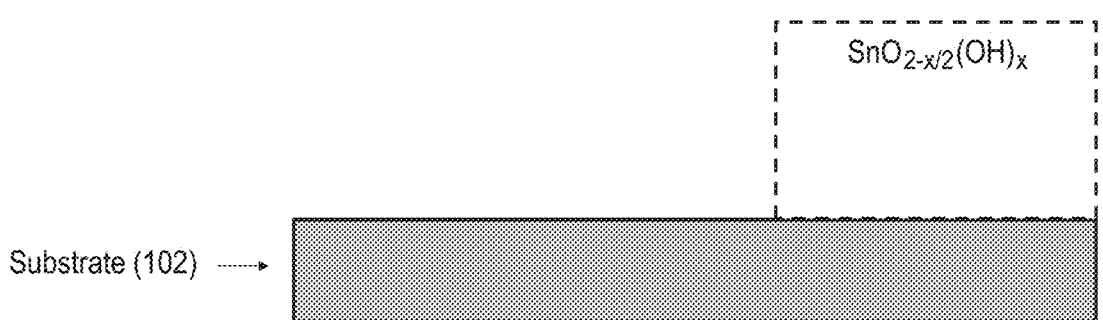
FIG. 5 is a schematic side view showing the pattern resulting from dry development with a halide species with an oxidizing agent.

Referring now to FIGS. 4 and 5, the improvements resulting from the delivery of an oxidizing agent is shown schematically in comparison with analogous FIGS. 2 and 3. The delivery of the oxidizing agent as described herein can reduce or eliminate formation of non-volatile materials, such as $SnX_2$, which involves reduction of tin+4 to tin+2. By reduction of formation of undesirable by-products, the corresponding yield of the desired volatile products can be enhanced. Thus, FIG. 4 shows the reaction with the presence of an oxidizing agent to avoid the formation of the $SnX_2$ by-product. The presence of oxidizing gases may slow the halogenation reactions, but the ratios of gas concentrations can be adjusted to allow the halogenation reactions to still occur at an appropriate rate. The resulting cleaner developed structure is shown schematically in FIG. 5.

In some embodiments, the present disclosure describes methods and compositions that can alleviate the formation of non-volatile residues during development of organotin coatings with halide vapor. As described herein, introduction of an oxidizing agent in the development process can lead to improved development with a halide composition. In some embodiments, the developer atmosphere can comprise an oxidizing agent mixture with a halide composition. The developer atmosphere can further comprise inert gases that can be used to maintain an overall pressure in the chamber. In some embodiments, the oxidizing agent can comprise at least 1% by mol. of the total mixture, in some embodiments the oxidizing agent can comprise at least 20% by mol. of the total mixture, in further embodiments the oxidizing agent can comprise from about 50% by mol. to about 99% by mol. of the total mixture, and in further embodiments the oxidizing agent can comprise from about 75% by mol. to about 90% by mol. of the total mixture. The quantities can depend on the nature of the coatings, and the strength of the halogen agent and oxidizing agent. With relatively strong oxidizing agents, such as $O_3$ or $H_2O_2$, the development atmosphere can have from about 1 mol % to about 15 mol %, In some embodiments from about 1 mol % to about 12 mol %, and in further embodiments from about 2 mol % to about 10 mol % of the oxidizing agents. For relatively weak oxidizing agents, such as $O_2$ or $H_2O$, the development compositions can have from about 10 mol % to about 99 mol % oxidizing agent, in further embodiments from about 15 mol % to about 95 mol % oxidizing agent, and in other embodiments from about 50 mol % to about 90 mol %, as well as ranges formed from these ranges with different combinations of the lower ranges and upper ranges. The flow rates for the oxidizing agents in the process chamber generally are commensurate with the halide developer to result in the desired ratio of gas species in the chamber. Thus, the flow rate of the oxidizing agents can span a large range from about 1 sccm to about 100,000 sccm and in further embodiments from about 10 sccm to about 25,000 sccm. A person of ordinary skill in the art will recognize that additional ranges of oxidizing gas parameters within the explicit ranges above are contemplated and are within the present disclosure.

Also, it can be desirable for the developer atmosphere to further comprise an optional dihalide, $F_2$, $Cl_2$, $Br_2$, $I_2$ or mixtures thereof, to provide another halide source. The development atmosphere can comprise, if present, from about 0.5 mol % to about 15 mol % and in further embodiments from about 1 mol % to about 10 mol % of dihalides, not counting inert gas contributions. The flow rate of the dihalides can be set to be proportional to the total flow of the halide developer and the oxidizing gas, based on the mole percent of the ancillary compounds. Inert gas can be provided as a moderator and/or to maintain the pressure at desired values without necessarily increasing the amounts of active compounds. The flow of inert gas may depend on the target chamber pressure, but may range from about 10 sccm to about 200,000 sccm, and in further embodiments from about 50 sccm to about 100,000 sccm. In some embodiments, the halide developer can be blended with air for performing the development, and the air may or may not be supplemented with additional oxidizing compounds and/or dried, partially dried or hydrated to adjust water vapor content. Air provides a natural amount of inert gases, primarily $N_2$ with some Ar, as well as some $CO_2$, although air can be supplemented with nitrogen or other inert gases to adjust their concentration. Similarly, a gas composition with components of air can be formed by mixing the appropriate gas species to achieve desired gas concentrations. If air is used, flow rates can be evaluated based on the constituent components of the total flow, specifically inert gases, $O_2$, $H_2O$, $CO_2$, halide developers, and supplemented species. Additional ranges within the disclosed ranges are contemplated and within the scope of the disclosure. The developer composition can be delivered with an inert gas, which is not considered with respect to the developer composition molar concentrations described above. The inert gas flow can be separately adjusted to influence the development rate and flow rate through the apparatus.

In some embodiments, the oxidizing agent can be delivered alternatively in a multi-step process that includes development with a halide composition. For example, in some embodiments, the organotin coating can be exposed to an oxidizing agent in a thermal or plasma process prior to development with a halide composition. As noted above, this pre-exposure to an oxidizing atmosphere can be combined with the PEB and/or performed as a separate step. Pre-exposure can be desirable to provide a preventative approach to limit scum formation, which can be particularly efficient. Similarly, in some embodiments, the organotin coating can be exposed to an oxidizing agent in a thermal or plasma process subsequent to development with a halide composition. In some embodiments, a primary development step comprising exposure to a halide composition can be performed, followed by exposure to an oxidizing agent in a thermal or plasma process. Then, the processing flow can be followed by a second development process step (halide based thermal development) or a scum removal step, which can comprise exposure to a halide composition or to a contrast enhancing agent. A second development or scum removal step can be a dry or solution based process. In some embodiments, a cyclic process can be performed wherein exposure to an oxidizing agent in a thermal process followed by a development process comprising a halide is repeated one or more times. In further embodiments, the oxidizing agent can be present continuously before, during and after delivery of the halide developing agent, or portions thereof of this extended time frame, in which the timings of the individual delivery steps can be adjusted to obtain desired patterning results. For example, a PEB can be performed with air, perhaps supplemented with other gases, the dry development can be formed with air and added halide developer, and the chamber can be flushed with air, nitrogen or other gases following the development step.

In some embodiments, the oxidizing agent can comprise an oxygen containing species, such as $O_2$, $O_3$, $H_2O$, $H_2O_2$, $NO_2$, NO, or mixtures thereof. In some embodiments, suitable oxidizing agents may include those that are able to substantially oxidize $Sn^{2+}$ to $Sn^{4+}$ or to sacrificially prevent the reduction of $Sn^{4+}$ to $Sn^{2+}$. With respect to these proposed mechanisms, Applicant does not want to be limited by theory. The oxidizing agent can be delivered to the substrate in any suitable method, such as flowing the oxidizing agent vapor over the substrate in a thermal or plasma process, or in some embodiments, as a liquid composition, which may be delivered as an aerosol.

In some embodiments, a thermal process may comprise controlling the temperature of the substrate during contact with the oxidizing agent and/or developing composition. Such thermal processes can generally include cooling or heating. In some embodiments, it may be beneficial to cool the substrate during its exposure to the oxidizing agent and/or development composition in order to better control the reaction rates and improve the subsequent pattern fidelity. A thermal based dry development step can nevertheless be formed at a suitable temperature generally from about −80° C. to about 400° C., in further embodiments from about −25° C. to about 250° C., in other embodiments form about −10° C. to about 150° C., and in some embodiments from about 0° C. to about 100° C. For some cooling embodiments, liquid nitrogen can be a particularly useful coolant. In other embodiments, the thermal process can comprise heating the substrate. The development times can range from about 2 seconds to about 10 minutes, in further embodiments from about 5 seconds to about 7 minutes, and in other embodiments from about 8 seconds to about 5 minutes. The choice of temperature may depend on the development gas concentrations and compositions. A person of ordinary skill in the art will recognize that additional ranges of temperatures and times within the explicit ranges above are contemplated and are within the present disclosure. Generally, process times and temperatures may be selected in part based on gas flow rates and pressures. The dry development processing described herein can be performed after a preliminary development step, such as a solution based development step or a plasma development step, in which case the dry thermal development can be considered if desired as a descumming step.

In some embodiments, it can be desirable to perform a rinse/descum process after an initial halide development process. In some embodiments, the rinse/descum composition can comprise exposing the substrate to a liquid rinse/descum composition. The rinse/descum composition can be delivered to the substrate by any means known in the art such as dispensing a volume of liquid onto the surface of the wafer while the wafer is either stationary (i.e., a static process) or spinning (i.e., a dynamic process). The use of a rinse liquid to perform de-scumming is described in U.S. Pat. No. 11,480,874B2 to Kocsis et al., entitled "Patterned Organometallic Photoresists and Method of Patterning," incorporated herein by reference. Liquid developers described in the '627 application can also be used as rinses.

In other embodiments, the rinse/descum process can comprise exposing the substrate to a descum process in a dry thermal or plasma process. In some embodiments, the rinse/descum composition can comprise an alcohol, a carboxylic acid, a ketone, an ester, an ether, or mixture thereof. A plasma etch can be desirable to remove scum. For example, plasmas comprising helium, argon, or halide may be effective for scum removal and/or pattern smoothing. Suitable halide compounds for plasma processing include, for example, $SF_6$, $CF_4$, $CHF_3$, HCl, $BCl_3$, HBr, and mixtures thereof, and of the like. In contrast to the thermal vapor-based development processes discussed herein, such plasmas generally comprise radicals and/or ions and can generally etch the resist material and/or scum via a physical etch process. The plasma processing can be performed at pressures generally below about 2 Torr, and in further embodiments from about 50 mTorr to about 1 Torr. The flow rates for the plasma etch can be from about 50 sccm to about 1000 sccm. An appropriate RF frequency can be used, and the plasma power can be from about 10 W to about 1000 W at a bias voltage from about 10 V to about 500 V. The plasma process generally is not particularly sensitive to temperature and can be performed at room temperature. Plasma process times can be short, such as from about 0.1 seconds (s) to about 10 s. A person of ordinary skill in the art will recognize that additional ranges of plasma descumming within the explicit ranges above are contemplated and are within the present disclosure.

In some embodiments, rinse/descum composition can be delivered optionally in the presence of an inert gas, such as $N_2$, He, Ne, Ar, Kr, and/or Xe, which generally involves a pulsed or continuous flow through the system. The amount of inert gas flow can moderate the development and/or rinse (contrast enhancing) reactions. If present, the inert gas can generally be selected in a range from about 1 mole percent (mol %) to about 99 mol % and any value or ranges within this range.

With respect to plasma processing herein, it may be desirable to contact the developed substrate with a plasma for scum removal. In a plasma process, the photoresist is exposed to suitable chemical species including ions and/or radicals of one or more gases. The plasma process may occur in a plasma-generating chamber or in proximity to a plasma-generating chamber such that the ions and/or radicals can reach the photoresist material. The plasma-generating chamber may comprise any suitable plasma reactor, such as an inductively coupled plasma (ICP) reactor, a transformer-coupled plasma (TCP) reactor, or a capacitively-coupled plasma (CCP) reactor. Such reactors can be configured with appropriate techniques and equipment known in the art. The plasma intensity can be characterized with a power, voltage and frequency. Suitable plasma powers can be from about 50 W to about 1000 W. The plasma voltage bias between the substrate and the plasma source generally can be from about 10V and 500V. The frequency generally can be in the high radio frequency range. Subranges and values within these plasma characterizing ranges are contemplated and are within the present disclosure.

In some embodiments of the development process, a number of inlets and outlets can be attached to the chamber to afford delivery of desired gases and/or vapors into the chamber and for removal of species from the chamber via vacuum or gas flow. A mount for a substrate comprising the photoresist desired to be developed can be present within the chamber, or in close proximity to the chamber such that the related plasma-generated ions and/or radicals can reach the photoresist on the substrate surface.

The rinse/descum composition can be introduced to the plasma process chamber containing the substrate by flowing the rinse/descum composition into the chamber at a desired flow rate and/or at a constant pressure. The flow rates and pressures can have transient behaviors as target values are set. If more than one rinse/descum compound (plasma generating compound) and/or inert gas are used in the process, the partial pressures and/or flow rates of each individual compounds and/or inert gas can be controlled. In some embodiments, the partial pressure of each compound in the chamber can be from between about 5 milliTorr (mT) and about 1000 mT, from about 50 mT to about 800 mT in other embodiments, from about 100 mT to about 700 mT in other embodiments, and from about 250 mT to about 500 mT in further embodiments. Inert gas concentrations can be adjusted to achieve desired chamber pressures. Pressures may be controlled with a particular pumping rate by varying the flow rates of each individual gas into the process chamber, for example, between from about 100 sccm to about 1000 sccm, in some embodiments, from about 200 sccm to about 800 sccm in other dements, and from about 300 to about 600 sccm in further embodiments. One of ordinary skill in the art will understand that additional ranges of pressures and flow rates within the above ranges are contemplated and within the scope of the disclosure.

Following an initial development process comprising a halide composition, it may be desirable to conduct a further thermal or plasma process on the patterned substrate. In some embodiments, the initial development process can comprise a solvent development process. Solvent development of organotin resists has been described for both negative tone and positive tone processing. During an initial development, a substantial amount of material is removed from the substrate based on the above discussions, such as in a negative tone or positive tone development process. In some cases, however, an initial development process can yield patterns having undesirably high line-width roughness (LWR) and/or defects, such as scum, residues, microbridges, and the like, remaining on the substrate due to incomplete development, material inhomogeneity, and stochastic effects, for example. In some embodiments, it can therefore be desirable to conduct a further thermal or plasma process to remove the unwanted material, which may be more susceptible to development chemistries described herein.

Figure 6:
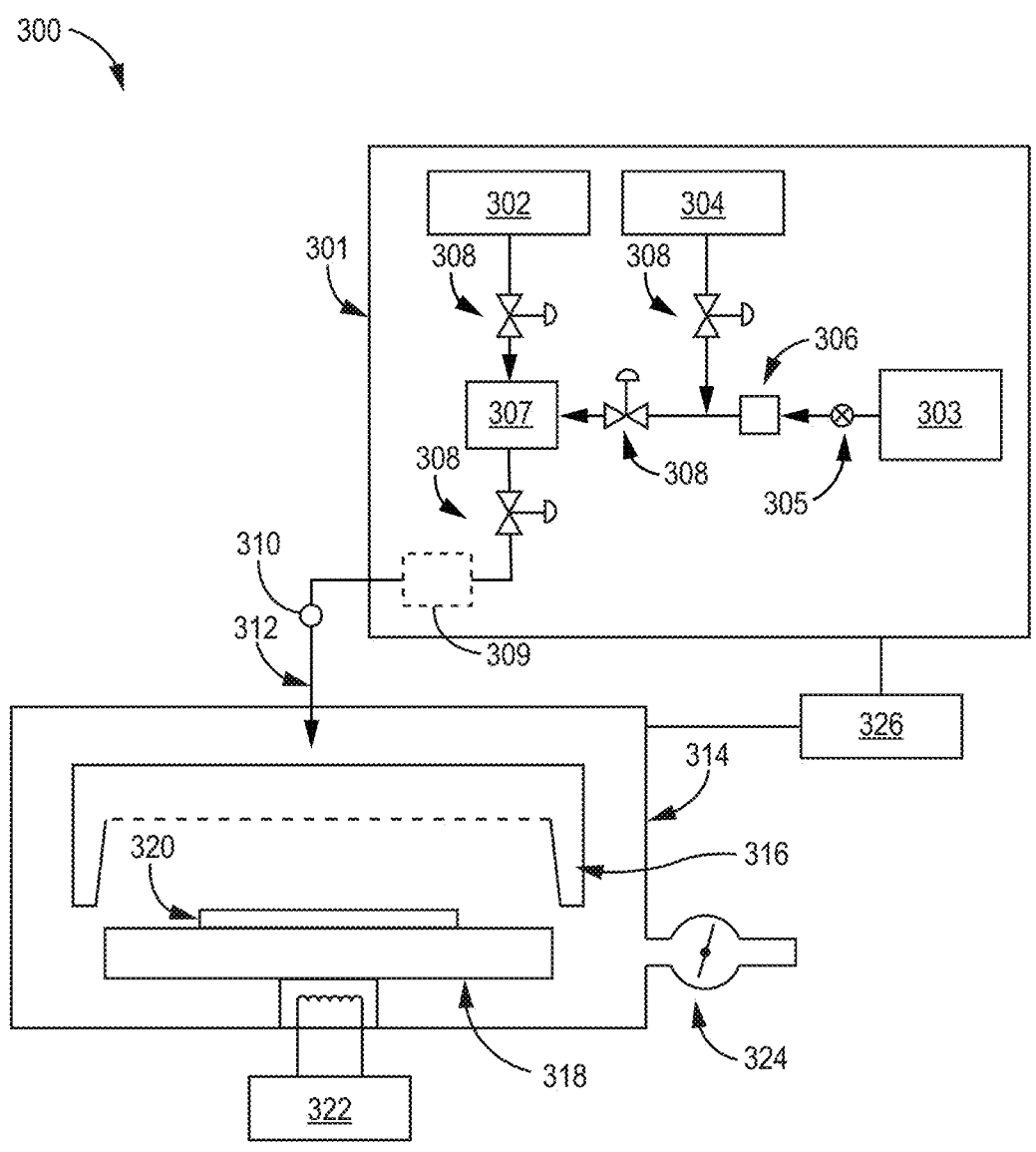
FIG. 6 is a schematic perspective view of a process system shown with a vapor delivery system connected to a process chamber.

A schematic layout of a suitable process system 300 is presented in FIG. 6. Process system 300 has vapor delivery system 301 and process chamber 314. In some embodiments, vapor delivery system 301 comprises process gas assembly 302. The schematic depiction of process gas assembly 302 is intended to convey the concept of potentially one or a plurality of independently controlled process gas reservoirs within process gas assembly. In some embodiments, vapor delivery system 301 comprises process liquid assembly 303, which can also comprise one or a plurality of independently controlled reservoirs. Process gas assembly 302 and/or process liquid assembly 303 can comprise a halide source and an oxidizing agent source, as well as in some embodiment, ancillary process gases, as described above. In some embodiments, vapor delivery system 301 comprises inert gas source 304. If air is to be supplied by vapor delivery system, air can be from a reservoir in process gas assembly 302 or an intake opening to capture air form the ambient atmosphere. Vapor delivery system 301 can comprise an air conditioner to dry and/or hydrate air to achieve a target humidity level. Process liquid assembly 303 can be configured to deliver a process liquid via liquid flow controller 305 to vaporization unit 306, which can be a bubbler, flash evaporator or other convenient component. Inert gas, such as from inert gas assembly 304, can be delivered to process liquid assembly 303 to facilitate vapor delivery. Mixing unit 307 receives a controlled flow of process gas from process gas assembly 302, vaporized process liquid from vaporization unit 306, and/or inert gas 304, each of which is controlled via one or more inlet valves 308, which can comprise mass flow controllers. Temperature controller 309 can be provided to control the temperature of process vapor 312 entering process chamber 314, and temperature controller 310 can comprise a heater and/or cooler. In some embodiments, vapor delivery system 301 has plasma unit 310.

Figure 7:
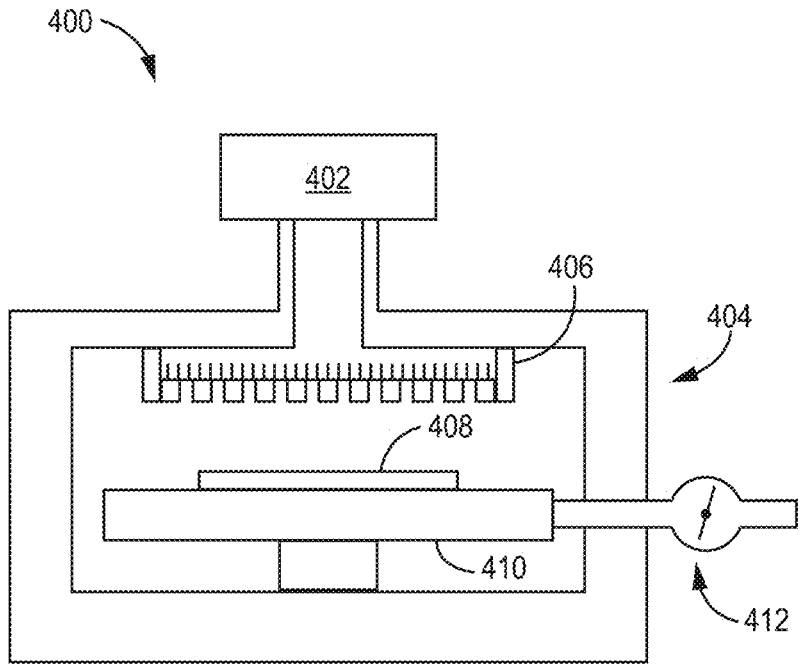
FIG. 7 is a schematic perspective view of a process system having a showerhead vapor distribution unit.

Process chamber 314 can comprise vapor distribution unit 316. Vapor distribution unit 316 may have various shapes and designs. In some embodiments, vapor distribution unit 316 has a showerhead shape with a multiple port design, one embodiment of which is shown in FIG. 7. Process chamber 314 has support 318, which in some embodiments can hold a plurality of substrates, such as wafers. Substrate 320 is located beneath vapor distribution unit 316 and rests on support 318. In some embodiments, support 318 may be temperature controlled via heating/cooling unit 322. Support 318 may be connected to a motor to spin support 318 for substrate processing. Support 318 may be manually or remotely raised or lowered to adjust the distance between the substrate and the vapor distribution unit. Pressure valve 324 provides for control of the pressure and the concentration of volatile reaction products in process chamber 314. Pressure valve 324 may be connected to a vacuum pump. In some embodiments, process system 300 has a remote plasma unit connected directly to process chamber 314. In the embodiment shown in FIG. 6, the remote plasma unit has matching network 328 and RF power supply 330. In some embodiments, controller 326 is provided to remotely control the elements of process system 300. Additional apparatus details for a development apparatus are generally known in the art, as described in published U.S. patent application 2014/0352736A1 to Yamamoto et al., entitled "Cleaning Apparatus and Cleaning Method Coater/Developer and Coating and Developing Method, and Computer Readable Storing Medium," and published PCT application WO 2022/125388 to Dictus et al., entitled "Photoresist Development With Organic Vapor," both of which are incorporated herein by reference.

After completion of the development step, the coating materials can be heat treated to further condense the material and to further dehydrate, densify, or remove residual developer from the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, nonthermal treatments, including blanket UV exposure, or exposure to an oxidizing plasma such as $O_2$, $O_3$, $H_2O_2$, and the like, may also be employed for similar purposes.

Once the development of the pattern is completed and any descumming is completed, the patterned material can be used as a mask for further processing of the substrate. The mask can be used to etch into the substrate and/or to deposit onto the substrate. In this way, the substrate can be modified to introduce functionalities. Generally, for device formation, patterning is repeated to form desired structures. The mask formed from the metal oxide based patterning material can be stripped if desired using an appropriate wet or dry etch.

FURTHER INVENTIVE CONCEPTS

1. A development chamber comprising:
   an enclosure configured for achieving a controlled pressure through operation of a pump and suitable pressure sensors;
   a substrate support within the enclosure;
   a development energy source comprising a heater, a cooler, and/or a plasma source configured to deliver energy to a substrate mounted on the substrate support;
   a halide developer source configured to deliver a gas of halide developer into the enclosure from a reservoir through a flow regulator; and
   an oxygen compound source configured to deliver a vapor of an oxygen comprising compound into the enclosure from a reservoir through a flow regulator.
2. The development chamber of inventive concept 1 wherein the development energy source comprises a heater and/or cooler.
3. The development chamber of inventive concept 1 wherein the halide developer source comprises a source of hydrogen halide.
4. The development chamber of inventive concept 1 wherein the oxygen source comprises air.
5. The development chamber of inventive concept 4 further comprising an air conditioner that dries or hydrates air to achieve a desired humidity level.
6. The development chamber of inventive concept 1 further comprising a controller to monitor and adjust temperature, flows and/or pumping to maintain the target process conditions.
7. The development chamber of inventive concept 1 the halide developer source is configured to deliver the gas toward a substrate mounted on the substrate support.
8. The development chamber of inventive concept 1 wherein the substrate support can support a plurality of substrates.
A1. A method for transforming an irradiated substrate to form a physical pattern along the surface wherein the irradiated substrate comprises a radiation sensitive organotin composition patterned with radiation, the method comprising:
   performing in an enclosure, a post-exposure bake (PEB) on a substrate having a surface with a pattern generated by irradiated regions and non-irradiated regions of an organometallic radiation sensitive material having carbon-metal bonds, wherein heating is performed at a pressure of at least about 200 Torr at a temperature from 60° C. to about 250° C.

for from about 0.1 minutes to about 30 minutes under an atmosphere comprising oxygen source molecules; and developing the physical pattern by introducing a halogen based development gas into the enclosure to substantially remove the non-irradiated organometallic radiation sensitive material and forming a physical pattern.

A2. The method of inventive concept A1 wherein the PEB is performed under an atmosphere comprising air.

A3. The method of inventive concept A2 wherein the air is conditioned to adjust the water content and/or $CO_2$ content.

A4. The method of inventive concept A1 wherein the halogen development gas is introduced into the enclosure after adjusting the enclosure to a temperature from about −25° C. to about 150° C.

A5. The method of inventive concept A1 wherein the enclosure is not purged following the PEB and prior to the introduction of the halogen development gas.

A6. The method of inventive concept A1 wherein the irradiated regions are formed by contact with EUV radiation.

A7. The method of inventive concept A1 wherein the organometallic radiation sensitive material comprises an organo tin oxide-hydroxide composition represented by the formula $RSnO_{1.5-x/2}(OH)_x$ wherein $0<x<3$, and R forms a carbon-tin bond and is a hydrocarbyl group having from 1 to 31 carbon atoms with 3 to 31 carbon atoms for the group with a secondary-bonded carbon atom and 4 to 31 carbon atoms for the group with a tertiary-bonded carbon atom, optionally with unsaturated or aromatic carbon bonds.

A8. The method of inventive concept A7 wherein carbon-tin bonds are cleaved by radiation to form the irradiated regions.

A9. The method of inventive concept A1 wherein the development is a thermal process with the developing step performed at a temperature from about −25° C. to about 250° C.

A10. The method of inventive concept A1 wherein the processing is performed in a chamber at a pressure of at least about 5 Torr.

A11. The method of inventive concept A1 wherein the halogen based developer is provided at a flow rate from about to about 50 sccm to about 5000 sccm.

A12. The method of inventive concept A1 wherein the gas comprises at least about 50 mole % oxygen source compound excluding inert gases.

A13. The method of inventive concept A1 wherein the gas comprises air.

A14. The method of inventive concept A1 wherein the gas comprises from about 1 mol % to about 10 mol % dihalides excluding inert gas contributions.

A15. The method of inventive concept A1 further comprising performing a plasma descumming after completing the developing to at least partial removal of the organo-tin composition having carbon-tin bonds.

B1. A method for transforming an irradiated substrate to form a physical pattern along the surface wherein the irradiated substrate comprises a radiation sensitive organotin composition patterned with radiation, the method comprising:

developing a physical pattern by introducing a halogen development gas into an enclosure to substantially remove non-irradiated organometallic radiation sensitive material and forming a physical pattern;

subjecting the substrate with the physical pattern on a substrate to oxidation for from about 0.1 minutes to about 30 minutes under an atmosphere comprising oxygen source molecules to form an oxidized patterned substrate; and contacting the oxidized patterned substrate with a halogen development gas to improve pattern development.

B2. The method of inventive concept B1 wherein heating is performed at a pressure of at least about 200 Torr at a temperature from 60° C. to about 250° C.

B3. The method of inventive concept B1 wherein the subjecting to oxidation is performed under a pressure of at least about 200 Torr.

B4. The method of inventive concept B1 wherein the oxygen source molecules comprises $O_2$, $O_3$, $H_2O$, $H_2O_2$, or combinations thereof.

B5. The method of inventive concept B1 wherein the atmosphere during oxidation comprises air.

B6 The method of inventive concept B1 wherein the contacting step is performed without purging the oxidation atmosphere.

B7. The method of inventive concept B1 wherein the halogen development gas comprises HF, HCl, HBr, HI, an acyl halide ($COX_2$), a carbonyl halide (RCOX), or a mixture thereof, wherein X is F, Cl, Br or I and R is an alkyl group with 1 to 5 carbon atoms.

B8. The method of inventive concept B1 wherein the oxygen source compound comprises $O_2$, $O_3$, $H_2O$, $H_2O_2$, $NO_2$, NO or mixtures thereof.

B9. The method of inventive concept B1 wherein the developing and contacting are thermal processes with performed at a temperature from about −25° C. to about 250° C.

B10. The method of inventive concept B1 wherein the developing is performed in a chamber at a pressure of at least about 5 Torr.

B11. The method of inventive concept B1 wherein the halogen development gas is provided at a flow rate from about to about 50 sccm to about 5000 sccm.

B12. The method of inventive concept B1 wherein the organotin composition having carbon-tin bonds comprises a composition represented by the formula $RSnO_{1.5-x/2}(OH)_x$ wherein $0<x<3$, and R forms a carbon-tin bond and is a hydrocarbyl group having from 1 to 31 carbon atoms with 3 to 31 carbon atoms for the group with a secondary-bonded carbon atom and 4 to 31 carbon atoms for the group with a tertiary-bonded carbon atom, optionally with unsaturated or aromatic carbon bonds.

B13. The method of inventive concept B1 wherein the halogen development gas comprises from about 1 mol % to about 10 mol % dihalides excluding inert gas contributions.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated. As would be understood by a person of ordinary skill in the art, the use of the term "about" herein refers to measurement error for the particular parameter unless explicitly indicated otherwise.

What is claimed is:

1. A method for performing a dry development of an organotin composition patterned with radiation and having a latent image, the method comprising:

developing a structure with a gas comprising a halogen based developer and an oxygen source compound, wherein the structure comprises a substrate with layer of composition with a latent image with regions with at least partially condensed tin oxide-hydroxide and separate regions with an organotin composition having carbon-tin bonds, and wherein the developing results in at least partial removal of the organotin composition having carbon-tin bonds.

2. The method of claim 1 wherein the halogen based developer comprises HF, HCl, HBr, HI, an acyl halide $(COX_2)$, a carbonyl halide (RCOX), or a mixture thereof, wherein X is F, Cl, Br or I and R is an alkyl group with 1 to 5 carbon atoms.

3. The method of claim 1 wherein the halogen based developer comprises HF, HCl, HBr, HI, or a mixture thereof.

4. The method of claim 1 wherein the oxygen source compound comprises $O_2$, $O_3$, $H_2O$, $H_2O_2$, $NO_2$, NO or mixtures thereof.

5. The method of claim 1 wherein the organotin composition having carbon-tin bonds comprises a composition represented by the formula $RSnO_{1.5-x/2}(OH)_x$ wherein $0<x<3$, and R forms a carbon-tin bond and is a hydrocarbyl group having from 1 to 31 carbon atoms with 3 to 31 carbon atoms for the group with a secondary-bonded carbon atom and 4 to 31 carbon atoms for the group with a tertiary-bonded carbon atom, optionally with unsaturated or aromatic carbon bonds.

6. The method of claim 5 wherein the at least partially condensed tin oxide-hydroxide composition is formed from the composition represented by the formula $RSnO_{1.5-x/2}$ $(OH)_x$ wherein carbon-tin bonds are cleaved by radiation.

7. The method of claim 1 wherein the development is a thermal process with the developing step performed at a temperature from about −25° C. to about 250° C.

8. The method of claim 1 wherein the development is a thermal process with the developing step performed at a temperature from about 0° C. to about 150° C.

9. The method of claim 8 wherein the processing is performed in a chamber at a pressure of at least 5 Torr.

10. The method of claim 1 wherein the halogen based developer is provided at a flow rate from about to about 50 sccm to about 5000 sccm.

11. The method of claim 1 wherein the gas comprises at least 50 mole % oxygen source compound excluding inert gases.

12. The method of claim 1 wherein the gas comprises air.

13. The method of claim 12 wherein the water content of the air is adjusted to achieve a desired water partial pressure.

14. The method of claim 1 wherein the gas comprises from about 1 mol % to about 10 mol % dihalides excluding inert gas contributions.

15. The method of claim 1 wherein the regions with at least partially condensed tin oxide-hydroxide correspond to irradiated regions and have a lower concentration of carbon-tin bonds than the separate regions.

16. The method of claim 1 further comprising performing a post-exposure bake (PEB) step prior to the developing step, comprising heating the structure to a temperature from about 60° C. to about 250° C. for from about 0.1 minutes to about 5 minutes under a pressure of at least 200 Torr.

17. The method of claim 16 wherein the atmosphere during PEB comprises $O_2$, $O_3$, $H_2O$, $H_2O_2$, $CO_2$, or combinations thereof.

18. The method of claim 16 wherein the atmosphere during PEB comprises air.

19. The method of claim 16 wherein the developing step is performed without purging the PEB atmosphere.

20. The method of claim 1 further comprising performing a plasma descumming after completing the developing to at least partial removal of the organotin composition having carbon-tin bonds.

21. A development chamber comprising:

an enclosure configured for achieving a controlled pressure through operation of a pump and suitable pressure sensors;

a substrate support within the enclosure;

a development energy source comprising a heater, a cooler, and/or a plasma source configured to deliver energy to a substrate mounted on the substrate support;

a halide developer source configured to deliver a gas of halide developer into the enclosure from a reservoir through a flow regulator; and an oxygen compound source configured to deliver a vapor of an oxygen comprising compound into the enclosure from a reservoir through a flow regulator.

* * * * *